(12) United States Patent
Miyake et al.

(10) Patent No.: US 10,896,867 B2
(45) Date of Patent: Jan. 19, 2021

(54) TERMINAL PLATE AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Eitaro Miyake, Kawasaki Kanagawa (JP); Kazuya Kodani, Kawasaki Kanagawa (JP); Hiroshi Matsuyama, Himeji Hyogo (JP); Tatsuya Hirakawa, Takasago Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/295,741

(22) Filed: Mar. 7, 2019

(65) Prior Publication Data

US 2020/0091043 A1    Mar. 19, 2020

(30) Foreign Application Priority Data

Sep. 18, 2018 (JP) .................................. 2018-174264

(51) Int. Cl.
*H01L 23/492* (2006.01)
*H01L 25/07* (2006.01)
(Continued)

(52) U.S. Cl.
CPC ........ *H01L 23/4922* (2013.01); *H01L 25/072* (2013.01)

(58) Field of Classification Search
CPC ................................................. H01L 23/49575
See application file for complete search history.

(56) References Cited

U.S. PATENT DOCUMENTS 5,306,949 A    4/1994 Yamada et al.
6,353,258 B1*  3/2002 Inoue .................. H01L 23/5386
                                                  257/690
(Continued)

FOREIGN PATENT DOCUMENTS

JP    H5-144986 A    6/1993
JP    H8-195471 A    7/1996
JP    H11-356058 A   12/1999

*Primary Examiner* — Omar F Mojaddedi
(74) *Attorney, Agent, or Firm* — White & Case LLP

(57) ABSTRACT

Provided is a terminal plate according to an embodiment including: a first plate portion for being connected to a first semiconductor element; a second plate portion for being connected to a second semiconductor element; a third plate portion provided above the first plate portion and the second plate portion; a first connecting portion provided between the first plate portion and the third plate portion and connecting the first plate portion and the third plate portion; a second connecting portion provided between the second plate portion and the third plate portion and connecting the second plate portion and the third plate portion; a fourth plate portion provided above the first plate portion and the second plate portion and provided on the opposite side of the third plate portion with interposing the first and second plate portions; a third connecting portion provided between the first plate portion and the fourth plate portion and connecting the first plate portion and the fourth plate portion; a fourth connecting portion provided between the second plate portion and the fourth plate portion and connecting the second plate portion and the fourth plate portion; and a fifth plate portion provided above the fourth plate portion, the fifth plate portion connected to the fourth plate portion, and the fifth plate portion having a hole.

4 Claims, 2 Drawing Sheets

(51) Int. Cl.
*H01L 23/498* (2006.01)
*H01L 23/52* (2006.01)
*H01L 23/64* (2006.01)
*H01L 23/367* (2006.01)
*H01L 23/538* (2006.01)

(56) References Cited

U.S. PATENT DOCUMENTS

2007/0051974 A1* 3/2007 Azuma ................... H01L 24/41
 257/177
2016/0079142 A1* 3/2016 Hasegawa ............. H01L 23/492
 257/77

* cited by examiner

TERMINAL PLATE AND SEMICONDUCTOR DEVICE

CROSS-REFERENCE TO RELATED APPLICATION

This application is based upon and claims the benefit of priority from Japanese Patent Application No. 2018-174264, filed on Sep. 18, 2018, the entire contents of which are incorporated herein by reference.

FIELD

Embodiments described herein relate generally to a terminal plate and a semiconductor device.

BACKGROUND

Power semiconductor devices designed for power control, including a semiconductor element such as a metal-oxide-semiconductor field-effect transistor (MOSFET) or an insulated gate bipolar transistor (IGBT) have been developed for a wide range of fields such as power generation and power transmission, rotary machines such as pumps and blowers, power supplies such as communication systems and factories, railways by electric motors, electric vehicles, and home electronic products.

In general, in a power semiconductor device, a large electric power can be handled by connecting a plurality of semiconductor elements in parallel using a bonding wire or a terminal plate. In order to stably operate the power semiconductor device, it is preferable to connect a plurality of semiconductor elements in parallel in a state of inductance as low as possible. However, in reality, due to differences in current path length or the like, the operation timing such as switching of each semiconductor element is shifted, and thus, there is a problem in that unexpected vibration occurs in the output waveform of the power semiconductor device. Since the power semiconductor device handles a large electric power, even if the inductance is low, it has a large influence. Thus, such vibration becomes particularly serious.

DETAILED DESCRIPTION

Figure 1:
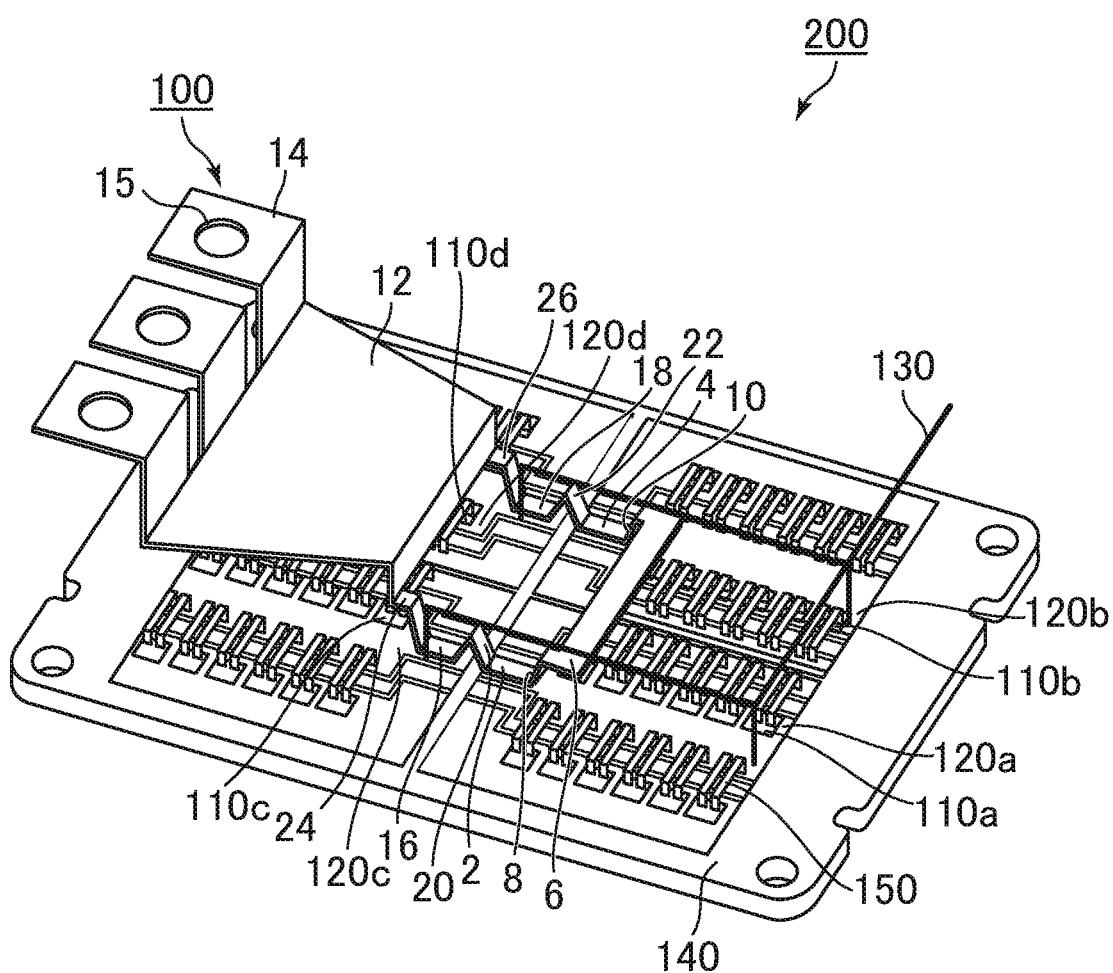
FIG. 1 is a schematic diagram of a terminal plate and a semiconductor device according to an embodiment.

Hereinafter, embodiments will be described with reference to the drawings. In the drawings, the same or similar components are denoted by the same or similar reference numerals.

In this specification, in some cases, the same or similar members are denoted by the same reference numerals, and redundant description is omitted.

In this specification, in order to indicate the positional relationship of components and the like, the upward direction of the drawing is described as "upper", and the downward direction of the drawing is described as "lower". In this specification, the concepts of "upper" and "lower" are not necessarily terms indicating the relationship with the direction of gravity.

Embodiment

A terminal plate according to an embodiment includes: a first plate portion for being connected to a first semiconductor element; a second plate portion for being connected to a second semiconductor element; a third plate portion provided above the first plate portion and the second plate portion; a first connecting portion provided between the first plate portion and the third plate portion and connecting the first plate portion and the third plate portion; a second connecting portion provided between the second plate portion and the third plate portion and connecting the second plate portion and the third plate portion; a fourth plate portion provided above the first plate portion and the second plate portion and provided on the opposite side of the third plate portion with interposing the first and second plate portions; a third connecting portion provided between the first plate portion and the fourth plate portion and connecting the first plate portion and the fourth plate portion; a fourth connecting portion provided between the second plate portion and the fourth plate portion and connecting the second plate portion and the fourth plate portion; and a fifth plate portion provided above the fourth plate portion, the fifth plate portion connected to the fourth plate portion, and the fifth plate portion having a hole.

A semiconductor device according to an embodiment includes a first semiconductor element; a first electrode member electrically connected to the first semiconductor element; a second semiconductor element; a second electrode member electrically connected to the second semiconductor element; and a terminal plate including a first plate portion connected to the first electrode member; a second plate portion connected to the second electrode member; a third plate portion provided above the first plate portion and the second plate portion; a first connecting portion provided between the first plate portion and the third plate portion and connecting the first plate portion and the third plate portion without interposing the first electrode member and the second electrode member; a second connecting portion provided between the second plate portion and the third plate portion and connecting the second plate portion and the third plate portion without interposing the first electrode member and the second electrode member; a fourth plate portion provided above the first plate portion and the second plate portion and provided on the opposite side of the third plate portion with interposing the first and second plate portions; a third connecting portion provided between the first plate portion and the fourth plate portion and connecting the first plate portion and the fourth plate portion without interposing the first electrode member and the second electrode member; a fourth connecting portion provided between the second plate portion and the fourth plate portion and connecting the second plate portion and the fourth plate portion without interposing the first electrode member and the second electrode member; and a fifth plate portion provided above the fourth plate portion, the fifth plate portion connected to the fourth plate portion, and the fifth plate portion having a hole.

FIG. 1 is a schematic diagram of a terminal plate 100 and a semiconductor device 200 according to the embodiment.

The semiconductor device 200 according to the embodiment is a power conversion device in which a plurality of semiconductor elements 110 are connected by electrode members 120, bonding wires 150, and a terminal plate 100.

The semiconductor device 200 includes the terminal plate 100, the semiconductor elements 110, the electrode members 120, an auxiliary wiring 130, a base 140, and the bonding wires 150.

The base 140 is a plate-shaped substrate made of, for example, Cu (copper) or AlSiC.

Herein, an x axis, a y axis perpendicular to the x axis, and a z axis perpendicular to the x axis and the y axis are defined. The surface of the base 140 is assumed to be disposed parallel to the xy plane.

The electrode members 120 are provided on the base 140. In FIG. 1, a first electrode member 120a, a second electrode member 120b, a third electrode member 120c, and a fourth electrode member 120d are provided as the electrode members 120. The electrode member 120 has, for example, a plate material made of Cu (copper). In addition, the electrode member 120 may be configured with, for example, two sheets of plate materials made of Cu with interposing a plate material made of ceramics such as AlN (aluminum nitride) or SiN (silicon nitride).

The semiconductor elements 110 are provided on the electrode members 120. In FIG. 1, as the semiconductor elements 110, a first semiconductor element 110a, a second semiconductor element 110b, a third semiconductor element 110c, and a fourth semiconductor element 110d are provided on the first electrode member 120a, the second electrode member 120b, the third electrode member 120c, and the fourth electrode member 120a, respectively.

The semiconductor element 110 is, for example, a vertical insulated gate bipolar transistor (IGBT) or a metal-oxide-semiconductor field-effect transistor (MOSFET). In a case where the semiconductor element 110 is a vertical p-channel MOSFET, the semiconductor element 110 is electrically connected to the electrode member 120 by a drain electrode (not illustrated) provided on the bottom surface of the semiconductor element 110. That is, the first semiconductor element 110a is electrically connected to the first electrode member 120a, the second semiconductor element 110b is electrically connected to the second electrode member 120b, the third semiconductor element 110c is electrically connected to the third electrode member 120c, and the fourth semiconductor element 110d is electrically connected to the fourth electrode member 120d. In addition, in this embodiment, the types, conductivity types, and the like of the semiconductor elements 110 are not particularly limited.

In addition, the semiconductor element 110 and the electrode member 120 may be electrically connected, for example, by connecting an electrode (not illustrated) provided on the upper surface of the semiconductor element 110 and the electrode member 120 with interposing the bonding wire 150.

The terminal plate 100 is provided on the electrode members 120.

The terminal plate 100 includes a first terminal portion 2 (an example of a first plate portion), a second terminal portion 4 (an example of a second plate portion), a first wiring portion 6 (an example of a third plate portion), a first connecting portion 8, a second connecting portion 10, a second wiring portion 12 (an example of a fourth plate portion), a third terminal portion 14 (an example of a fifth plate portion), a fourth terminal portion 16 (an example of a sixth plate portion), a fifth terminal portion 18 (an example of a seventh plate portion), a third connecting portion 20, a fourth connecting portion 22, a fifth connecting portion 24, and a sixth connecting portion 26.

The first terminal portion 2 is provided on the first electrode member 120a and is connected to the first electrode member 120a by, for example, an ultrasonic bonding method or solder. Thus, the first terminal portion 2 is electrically connected to the first semiconductor element 110a. In other words, the first terminal portion 2 is a portion for being electrically connected to the first semiconductor element 110a.

The second terminal portion 4 is provided on the second electrode member 120b while being separated from the first terminal portion 2 and is connected to the second electrode member 120b by, for example, an ultrasonic bonding method or solder. Therefore, the second terminal portion 4 is electrically connected to the second semiconductor element 110b. In other words, the second terminal portion 4 is a portion for being electrically connected to the second semiconductor element 110b.

The first wiring portion 6 is provided obliquely above the first terminal portion 2 and the second terminal portion 4. In FIG. 1, the first wiring portion 6 extends in the x direction.

The first connecting portion 8 is provided between the first terminal portion 2 and the first wiring portion 6 and connects the first terminal portion 2 and the first wiring portion 6 without interposing the electrode member 120.

The second connecting portion 10 is provided between the second terminal portion 4 and the first wiring portion 6 and connects the second terminal portion 4 and the first wiring portion 6 without interposing the electrode member 120.

The second wiring portion 12 is provided obliquely above the first terminal portion 2 and the second terminal portion 4. The second wiring portion 12 is, for example, a plate-shaped conductive member disposed on the base 140, the semiconductor element 110, and the bonding wire 150. For example, it is preferable that, when the terminal plate 100 is viewed from the above, the first terminal portion 2 and the second terminal portion 4 are provided between the first wiring portion 6 and the second wiring portion 12, because it is easy to handle the first wiring portion 6 and the second wiring portion 12. However, the disposition of the first wiring portion 6, the second wiring portion 12, the first terminal portion 2, and the second terminal portion 4 is not limited to the above disposition.

The third terminal portion 14 is provided above the second wiring portion 12 and is connected to the second wiring portion 12. The third terminal portion 14 has a hole 15 into which a bolt of, for example, about M5 or more and M10 or less, that is, a bolt having a bolt diameter of 5 mm or more and 10 mm or less can be inserted. With respect to the metal portion (not illustrated) having a nut of about M5 or more and M10 or less, that is, a nut having a nut diameter of 5 mm or more and 10 mm or less, by inserting the above-mentioned bolt into the hole 15 and tightening, it is possible to obtain good contact of the metal portion and the third terminal portion 14. Therefore, the power converted by the semiconductor device 200 can be satisfactorily transmitted to the metal portion.

The third connecting portion 20 is provided between the first terminal portion 2 and the second wiring portion 12.

The fourth connecting portion 22 is provided between the second terminal portion 4 and the second wiring portion 12.

The fourth terminal portion 16 is provided on the third electrode member 120c between the first terminal portion 2 or the third connecting portion 20 and the second wiring portion 12. The fourth terminal portion 16 is connected to the third electrode member 120c by, for example, an ultrasonic bonding method or solder. Therefore, the fourth terminal portion 16 is electrically connected to the third semiconductor element 110c. In other words, the fourth terminal portion 16 is a portion for being electrically connected to the third semiconductor element 110c.

The fifth terminal portion 18 is provided on the fourth electrode member 120d between the second terminal portion 4 or the fourth connecting portion 22 and the second wiring portion 12. The fifth terminal portion 18 is connected to the fourth electrode member 120d by, for example, an ultrasonic bonding method or solder. Therefore, the fifth terminal portion 18 is electrically connected to the fourth semiconductor element 110d. In other words, the fifth terminal portion 18 is a portion for being electrically connected to the fourth semiconductor element 110d.

The fifth connecting portion 24 is provided between the second wiring portion 12 and the fourth terminal portion 16 and connects the second wiring portion 12 and the fourth terminal portion 16 without interposing the electrode member 120.

The sixth connecting portion 26 is provided between the second wiring portion 12 and the fifth terminal portion 18 and connects the second wiring portion 12 and the fifth terminal portion 18 without interposing the electrode member 120.

The third connecting portion 20 connects the first terminal portion 2 and the fourth terminal portion 16 without interposing the electrode member 120 so as to straddle between the first terminal portion 2 and the fourth terminal portion 16. Therefore, the third connecting portion 20 connects the first terminal portion 2 and the second wiring portion 12 with interposing the fourth terminal portion 16 and the fifth connecting portion 24.

The fourth connecting portion 22 connects the second terminal portion 4 and the fifth terminal portion 18 without interposing the electrode member 120 so as to straddle between the second terminal portion 4 and the fifth terminal portion 18. Thus, the fourth connecting portion 22 connects the second terminal portion 4 and the second wiring portion 12 with interposing the fifth terminal portion 18 and the sixth connecting portion 26.

Each member of the semiconductor device 200 is thermally expanded by the heat generated when a current flows in the semiconductor device 200. For this reason, due to the difference in thermal expansion coefficient among the members, there is a concern that the first terminal portion 2, the second terminal portion 4, the fourth terminal portion 16, or the fifth terminal portion 18 is peeled off from the first electrode member 120a, the second electrode member 120b, the third electrode member 120c, or the fourth electrode member 120d. In order to suppress such peeling off, the first connecting portion 8, the second connecting portion 10, the third connecting portion 20, the fourth connecting portion 22, the fifth connecting portion 24, and the sixth connecting portion 26, which have some elasticity and absorb the difference in thermal expansion coefficient, are provided between the first terminal portion 2, the second terminal portion 4, the fourth terminal portion 16, and the fifth terminal portion 18 and a portion connecting other portions.

The auxiliary wiring 130 is provided on the electrode member 120 and connects the electrode member 120 without interposing the terminal plate 100. In FIG. 1, the auxiliary wiring 130 is connected to the first electrode member 120a, the second electrode member 120b, the third electrode member 120c, and the fourth electrode member 120d. An end portion 132 is provided in the auxiliary wiring 130 and is connected to, for example, a gate control circuit (not illustrated). The auxiliary wiring 130 is provided to electrically connect the electrode member 120 separately from the terminal plate 100 in order to acquire the reference potential of the gate control circuit. Unlike the terminal plate 100, a large current does not flow in the auxiliary wiring 130, so that no noticeable problem occurs even if the resistance is somewhat high. For this reason, for the auxiliary wiring 130, generally, a wiring having a smaller cross-sectional area than a member constituting the terminal plate 100 is used.

The terminal plate 100 is formed as an integral part by molding a plate made of Cu having a thickness of, for example, about 1 mm or more and 1.5 mm or less using, for example, a metal plate. The method of manufacturing the terminal plate 100 is preferred because the terminal plate can be easily formed. The thickness of the first terminal portion 2, the second terminal portion 4, the fourth terminal portion 16 or the fifth terminal portion 18 is preferably equal to or more than a half of a thickness of other portions of the terminal plate 100, e.g. the second wiring portion 12, because the first terminal portion 2, the second terminal portion 4, the fourth terminal portion 16 or the fifth terminal portion 18 became thinner by the process of the connection to the electrode member. However, the method of manufacturing the terminal plate 100 is not limited to the above terminal plate.

The size of the portions of the first terminal portion 2, the second terminal portion 4, the fourth terminal portion 16, and the fifth terminal portion 18 which are in contact with the electrode member 120, in other words, the size of the portions for being connected to the semiconductor devices is, for example, preferably equal to or less than 3.5 mm square, because it can be easily formed and a good connection to the electrode member 120 can be made.

Next, the functions and effects of the terminal plate 100 and the semiconductor device 200 according to the embodiment will be described.

Figure 2:
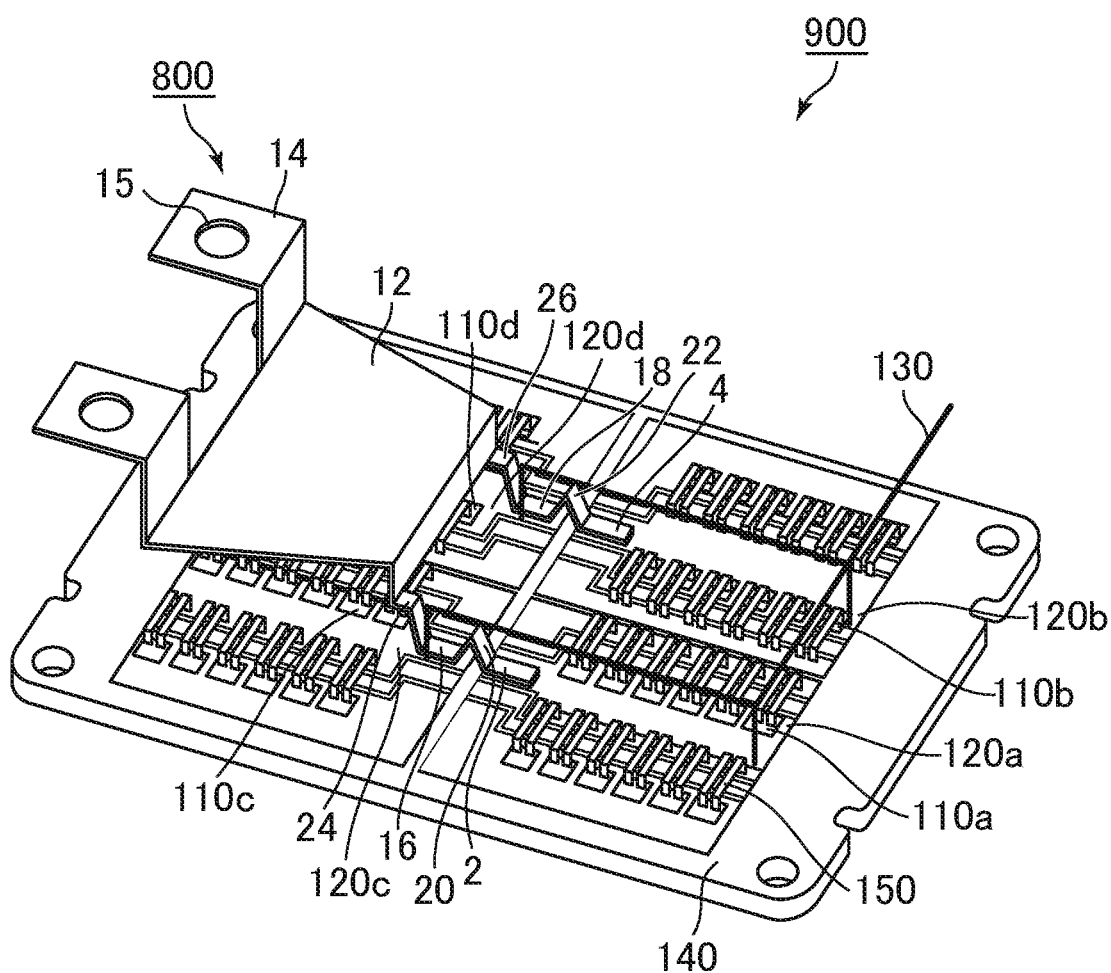
FIG. 2 is a schematic diagram of a terminal plate and a semiconductor device of Comparative Example.

FIG. 2 illustrates a schematic diagram of a terminal plate 800 and a semiconductor device 900, which is Comparative Example where the first wiring portion 6 is not provided. In this case, the path connecting the first terminal portion 2 and the second terminal portion 4 is only a path passing through the third connecting portion 20, the fourth terminal portion 16, the fifth connecting portion 24, the second wiring portion 12, the sixth connecting portion 26, the fifth terminal portion 18, and the fourth connecting portion 22. For this reason, there is a problem in that it is difficult to connect the first semiconductor element 110a connected to the first terminal portion 2 via the electrode member 120a and the second semiconductor element 110b connected to the second terminal portion 4 via the second electrode member 120b in a state of low inductance.

The terminal plate 100 according to the embodiment has a first wiring portion 6. Therefore, for example, as the paths of the terminal plate 100 to which the first semiconductor element 110a and the second semiconductor element 110b are connected, as illustrated in the terminal plate 800 of Comparative Example in FIG. 2, besides the path passing through the second terminal portion 4, the fourth connecting portion 22, the fifth terminal portion 18, the sixth connecting portion 26, the second wiring portion 12, the fifth connecting portion 24, the fourth terminal portion 16, the third connecting portion 20, and the first terminal portion 2, the path passing through the second terminal portion 4, the second connecting portion 10, the first terminal portion 6, the first connecting portion 8, and the first terminal portion 2 is provided. Therefore, since the first semiconductor element 110a and the second semiconductor element 110b can be connected in a state of lower inductance, it is possible to provide a terminal plate and a semiconductor device with lower inductance.

It is preferable that each member constituting the terminal plate 100 is formed as an integral body because the terminal plate can easily be produced.

While certain embodiments have been described, these embodiments have been presented by way of example only, and are not intended to limit the scope of the inventions. Indeed, the terminal plate and the semiconductor device described herein may be embodied in a variety of other forms; furthermore, various omissions, substitutions and changes in the form of the devices and methods described herein may be made without, departing from the spirit of the inventions. The accompanying claims and their equivalents are intended to cover such forms or modifications as would fall within the scope and spirit of the inventions.

What is claimed is:

1. A semiconductor device comprising:
   a first semiconductor element;
   a first electrode member electrically connected to the first semiconductor element;
   a second semiconductor element;
   a second electrode member electrically connected to the second semiconductor element;
   a third semiconductor element;
   a third electrode member electrically connected to the third semiconductor element;
   a fourth semiconductor element;
   a fourth electrode member electrically connected to the fourth semiconductor element;
   a terminal plate including:
   a first plate portion connected to the first electrode member;
   a second plate portion connected to the second electrode member;
   a third plate portion provided above the first plate portion and the second plate portion;
   a first connecting portion provided between the first plate portion and the third plate portion and connecting the first plate portion and the third plate portion without interposing the first electrode member and the second electrode member;
   a second connecting portion provided between the second plate portion and the third plate portion and connecting the second plate portion and the third plate portion without interposing the first electrode member and the second electrode member;
   a fourth plate portion provided above the first plate portion and the second plate portion and provided on an opposite side of the third plate portion with interposing the first and second plate portions;
   a third connecting portion provided between the first plate portion and the fourth plate portion and connecting the first plate portion and the fourth plate portion without interposing the first electrode member and the second electrode member;
   a fourth connecting portion provided between the second plate portion and the fourth plate portion and connecting the second plate portion and the fourth plate portion without interposing the first electrode member and the second electrode member;
   a fifth plate portion provided above the fourth plate portion, the fifth plate portion connected to the fourth plate portion, and the fifth plate portion having a hole;
   a sixth plate portion provided between the fourth plate portion and the third connecting portion and connected to the third electrode member;
   a seventh plate portion provided between the fourth plate portion and the fourth connecting portion and connected to the fourth electrode member;
   a fifth connecting portion provided between the fourth plate portion and the sixth plate portion and connecting the fourth plate portion and the sixth plate portion; and
   a sixth connecting portion provided between the fourth plate portion and the seventh plate portion and connecting the fourth plate portion and the seventh plate portion,
   wherein the third connecting portion connects the first plate portion and the fourth plate portion with interposing the sixth plate portion and the fifth connecting portion, and the fourth connecting portion connects the second plate portion and the fourth plate portion with interposing the seventh plate portion and the sixth connecting portion.

2. The semiconductor device according to claim 1, further comprising an auxiliary wiring connecting the first electrode member and the second electrode member without interposing the terminal plate.

3. The semiconductor device according to claim 1, wherein the first plate portion, the second plate portion, the third plate portion, the first connecting portion, the second connecting portion, the fourth plate portion, the third connecting portion, the fourth connecting portion, and the fifth plate portion are formed as an integral body.

4. The semiconductor device according to claim 1, wherein a thickness of the first plate portion or the second plate portion is equal to or more than a half of a thickness of the fourth plate portion, and a size of a portion of the first plate portion connected to the first electrode member and a size of a portion of the second plate portion connected to the second electrode member is equal to or less than 3.5 mm square.

* * * * *